United States Patent
Choi et al.

(10) Patent No.: US 9,034,725 B2
(45) Date of Patent: May 19, 2015

(54) METHODS OF FORMING TRANSISTORS AND METHODS OF MANUFACTURING SEMICONDUCTOR DEVICES INCLUDING THE TRANSISTORS

(71) Applicant: SAMSUNG ELECTRONICS CO., LTD., Suwon-si, Gyeonggi-do (KR)

(72) Inventors: Doo-Whan Choi, Hwaseong-si (KR); Jung-Bong Yun, Hwaseong-si (KR); Chang-Won Choi, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 8 days.

(21) Appl. No.: 14/030,668

(22) Filed: Sep. 18, 2013

(65) Prior Publication Data

US 2014/0087533 A1    Mar. 27, 2014

(30) Foreign Application Priority Data

Sep. 21, 2012   (KR) .................. 10-2012-0105328

(51) Int. Cl.

| | |
|---|---|
| H01L 21/76 | (2006.01) |
| H01L 29/66 | (2006.01) |
| H01L 27/06 | (2006.01) |
| H01L 21/8234 | (2006.01) |
| H01L 27/02 | (2006.01) |
| H01L 27/108 | (2006.01) |
| H01L 21/762 | (2006.01) |

(52) U.S. Cl.
CPC ...... *H01L 29/66477* (2013.01); *H01L 27/0629* (2013.01); *H01L 21/823481* (2013.01); *H01L 27/0207* (2013.01); *H01L 27/10814* (2013.01); *H01L 27/10876* (2013.01); *H01L 21/76229* (2013.01)

(58) Field of Classification Search
USPC .................. 438/422, 437, 453; 257/E21.553
See application file for complete search history.

(56) References Cited

U.S. PATENT DOCUMENTS

| | | | |
|---|---|---|---|
| 5,933,746 | A | 8/1999 | Begley et al. |
| 6,812,115 | B2 | 11/2004 | Wieczorek et al. |
| 7,176,039 | B1 | 2/2007 | Papasouliotis et al. |
| 7,709,371 | B2 | 5/2010 | Bhanap et al. |
| 2007/0007571 | A1* | 1/2007 | Lindsay et al. ............... 438/270 |

(Continued)

FOREIGN PATENT DOCUMENTS

| | | |
|---|---|---|
| KR | 10-2001-0038197 | 5/2001 |
| KR | 10-2010-0035000 | 4/2010 |

OTHER PUBLICATIONS

English Abstract for Publication No. 10-2001-0038197.

(Continued)

*Primary Examiner* — Chandra Chaudhari
(74) *Attorney, Agent, or Firm* — F. Chau & Associates, LLC

(57) ABSTRACT

A method of forming a transistor is provided. An upper portion of a substrate is partially removed forming a trench. An isolation layer partially fills the trench, forming active patterns of the substrate. The isolation layer has a void therein. A photoresist pattern is formed on the active patterns and the isolation layer. The active patterns and the isolation layer are partially removed using the photoresist pattern as an etching mask, thus forming a recess. A plasma treatment process is performed, removing the photoresist pattern and filling the void. A gate insulation layer and a gate electrode fill the recess.

15 Claims, 18 Drawing Sheets

(56) References Cited

U.S. PATENT DOCUMENTS

| | | |
|---|---|---|
| 2008/0135976 A1 | 6/2008 | Odajima |
| 2009/0068816 A1 | 3/2009 | Eun |
| 2010/0072569 A1 | 3/2010 | Han et al. |
| 2011/0143509 A1* | 6/2011 | Fujimoto ............... 438/270 |

OTHER PUBLICATIONS

English Abstract for Publication No. 10-2010-0035000.

* cited by examiner

FIG. 7A
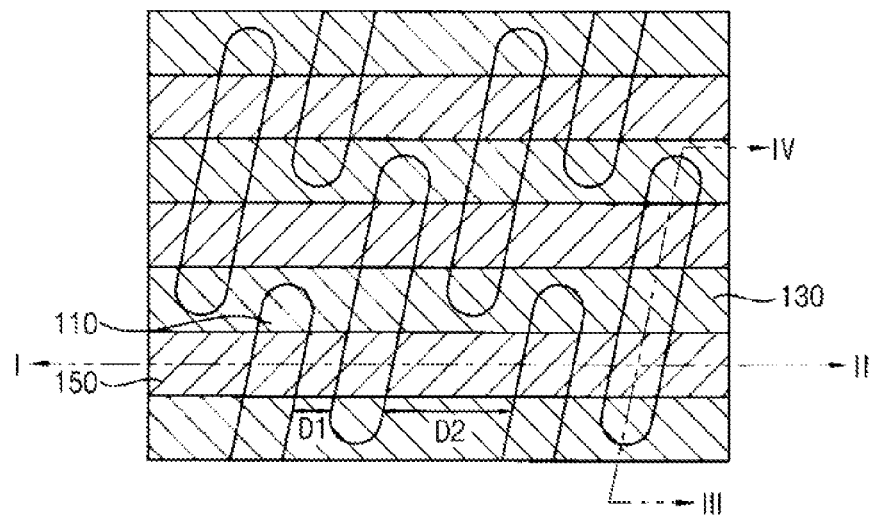
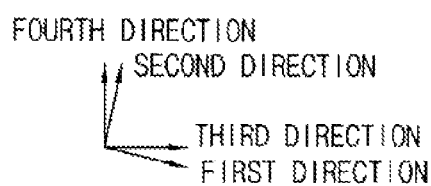
FIG. 7B
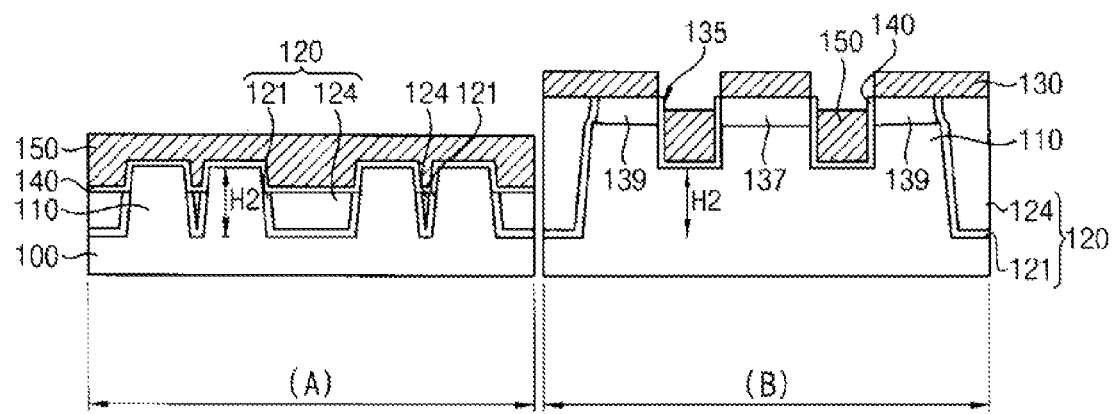

FIG. 15
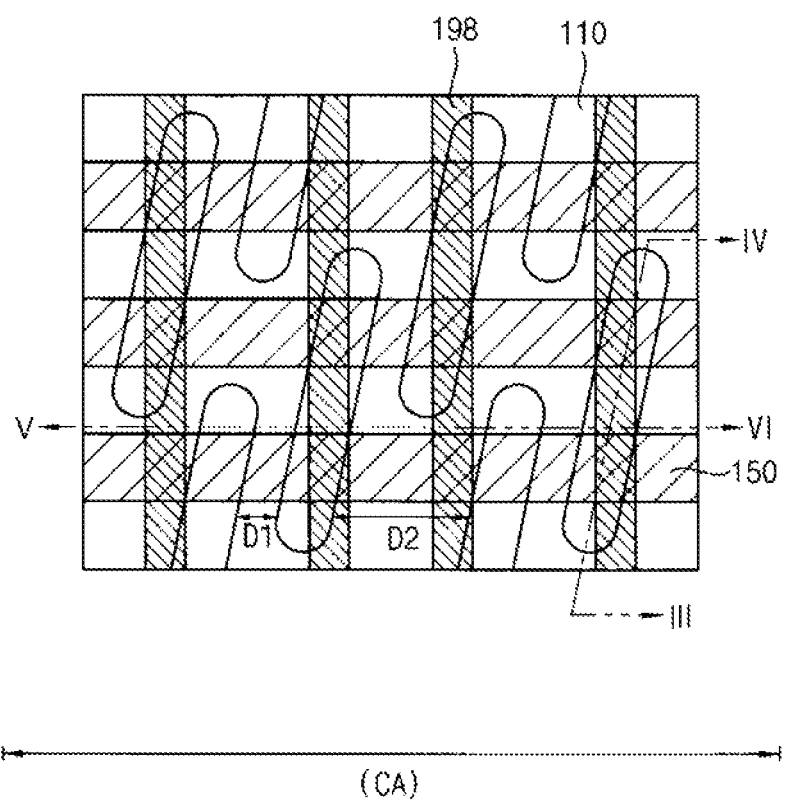
(CA)
FOURTH DIRECTION
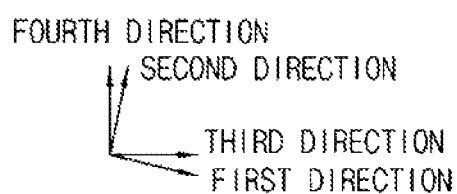

METHODS OF FORMING TRANSISTORS AND METHODS OF MANUFACTURING SEMICONDUCTOR DEVICES INCLUDING THE TRANSISTORS

CROSS-REFERENCE TO RELATED APPLICATION

This U.S. non-provisional application claims priority under 35 U.S.C. §119 to Korean Patent Application No. 10-2012-0105328, filed on Sep. 21, 2012 in the Korean Intellectual Property Office (KIPO), the disclosure of which is herein incorporated by reference in its entirety.

TECHNICAL FIELD

Exemplary embodiments of the present invention relate to semiconductor devices, and more specifically, to methods of forming transistors and methods of manufacturing semiconductor devices including the transistors.

DISCUSSION OF THE RELATED ART

As semiconductor device have been highly integrated, the size of MOS transistors included in the semiconductor devices has been decreased. Accordingly, the channel length of the MOS transistors decreases. There is a need for highly integrated MOS transistors that operate reliably.

SUMMARY

According to an exemplary embodiment of the present invention, there is provided a method of forming a transistor. In the method, an upper portion of a substrate is partially removed, forming a trench. An isolation layer partially fills, forming active patterns of the substrate. The isolation layer has a void therein. A photoresist pattern is formed on the active patterns and the isolation layer. The active patterns and the isolation layer are partially removed using the photoresist pattern as an etching mask, thus forming a recess. A plasma treatment process is performed, removing the photoresist pattern and filling the void. A gate insulation layer and a gate electrode fill the recess.

In an exemplary embodiment of the present invention, a first insulation layer pattern is formed on an inner wall of the trench using an oxide. A second insulation layer pattern is formed on the first insulation layer pattern using a nitride. The void may be disposed in the second insulation layer pattern.

In an exemplary embodiment of the present invention, the plasma treatment process may be performed under an atmosphere including oxygen.

In an exemplary embodiment of the present invention, the second insulation layer pattern may be oxidized, filling the void.

In an exemplary embodiment of the present invention, the photoresist pattern may be ashed by using an oxygen plasma.

In an exemplary embodiment of the present invention, a first insulation layer pattern may be formed on an inner wall of the trench using an oxide. The void may be disposed in the first insulation layer pattern.

In an exemplary embodiment of the present invention, the plasma treatment process may be performed under an atmosphere including oxygen and nitrogen.

In an exemplary embodiment of the present invention, the first insulation layer pattern may be nitrified, filling the void.

In an exemplary embodiment of the present invention, the plasma treatment process may be performed for about 60 seconds to about 180 seconds.

In an exemplary embodiment of the present invention, the gate electrode may have a top surface lower than a top surface of the substrate.

In an exemplary embodiment of the present invention, an impurity region may be formed by implanting impurities into an upper portion of the substrate. The impurity region may function as a source region or a drain region of the transistor.

According to an exemplary embodiment of the present invention, there is provided a method of forming a semiconductor device. In the method, an upper portion of a substrate is partially removed, forming a trench. An isolation layer partially fills the trench, forming active patterns of the substrate. The isolation layer has a void therein. A photoresist pattern is formed on the active patterns and the isolation layer. The active patterns and the isolation layer are partially removed using the photoresist pattern as an etching mask, thus forming a recess. A plasma treatment process is performed, removing the photoresist pattern and filling the void. A gate insulation layer and a gate electrode fill the recess. An insulating interlayer is formed on the substrate. The insulating interlayer receives a plug electrically connected to the substrate. A capacitor is electrically connected to the plug. The capacitor includes a lower electrode, a dielectric layer and an upper electrode.

In an exemplary embodiment of the present invention, a first insulation layer pattern may be formed on an inner wall of the trench using an oxide. A second insulation layer pattern may be formed on the first insulation layer pattern using a nitride. The void may be disposed in the second insulation layer pattern.

In an exemplary embodiment of the present invention, the plasma treatment process may be performed under an atmosphere including oxygen.

In an exemplary embodiment of the present invention, the second insulation layer pattern may be oxidized, filling the void. The photoresist pattern may be ashed by using an oxygen plasma.

According to an exemplary embodiment of the present invention, there is provided a method of forming a transistor. A trench and active patterns are formed by partially removing an upper portion of a substrate. Impurities are implanted into upper portions of the active patterns. The trench is filled with an isolation layer. A recess is formed by partially removing the active patterns. A plasma treatment process is performed on the substrate. The recess is filled with a gate insulation layer and a gate electrode.

In an exemplary embodiment of the present invention, the plasma treatment process may be performed under an atmosphere including oxygen and/or nitrogen.

In an exemplary embodiment of the present invention, the plasma treatment process may be performed under an atmosphere including oxygen and/or an insert gas.

In an exemplary embodiment of the present invention, the isolation layer may comprise a first insulation layer pattern on an inner wall of the trench and a second insulation layer pattern on the first insulation layer pattern.

In an exemplary embodiment of the present invention, the isolation layer may be oxidized or nitrified by the plasma treatment process.

BRIEF DESCRIPTION OF THE DRAWINGS

Exemplary embodiments will be more clearly understood from the following detailed description taken in conjunction with the accompanying drawings, wherein FIGS. 1A to 8A are plan views illustrating a method of forming a transistor in accordance with an exemplary embodiment of the present invention;

FIGS. 1B, 2B, 3B, 4B, 4C, 5B, 6B, 6C, 7B, and 8B are cross-sectional views illustrating a method of forming a transistor in accordance with an exemplary embodiment of the present invention;

FIG. 15 is a plan view illustrating a method of forming a semiconductor device in accordance with an exemplary embodiment of the present invention;

DETAILED DESCRIPTION OF THE EMBODIMENTS

Figure 1A:
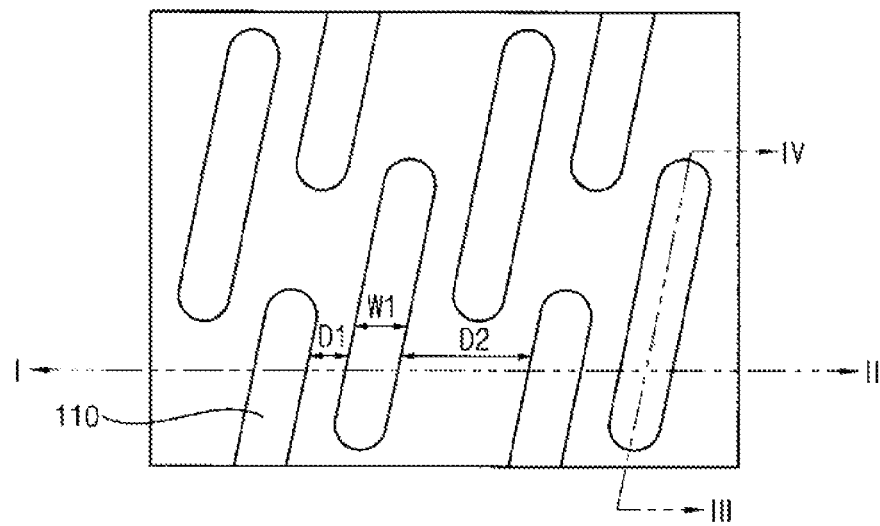

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity. The same denotations may be used to refer to the same or substantially the same elements throughout the specification and the drawings.

It will be understood that when an element or layer is referred to as being "on," "connected to" or "coupled to" another element or layer, it can be directly on, connected or coupled to the other element or layer or intervening elements or layers may be present. As used herein, the term "and/or" includes any and all combinations of one or more of the associated listed items.

As used herein, the singular forms "a," "an" and "the" are intended to include the plural forms as well, unless the context clearly indicates otherwise.

FIGS. 1A, 2A, 3A, 4A, 5A, 6A, 7A and 8A are plan views illustrating a method of forming a transistor in accordance with an exemplary embodiment of the present invention. FIGS. 1B, 2B, 3B, 4B, 5B, 6B, 7B and 8B include cross-sectional views (A) taken along lines I-II of FIGS. 1A, 2A, 3A, 4A, 5A, 6A, 7A and 8A and cross-sectional views (B) taken along lines of FIGS. 1A, 2A, 3A, 4A, 5A, 6A, 7A and 8A. FIGS. 4C and 6C include cross-sectional views (C) taken along lines V-VI of FIGS. 4A and 6A and cross-sectional views (B) taken along lines III-IV of FIGS. 4A and 6A.

Figure 1B:
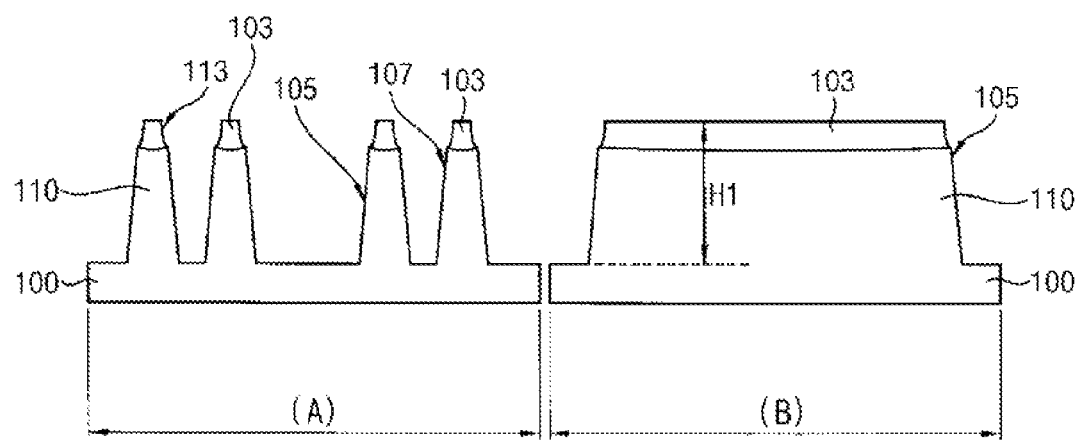

Referring to FIGS. 1A and 1B, after forming a first impurity region 103 on an upper portion of a substrate 100 by implanting impurities into the upper portion, the upper portion of the substrate 100 may be partially removed, thus forming a first trench 105 and a second trench 107. Thus, active patterns 110 may be formed.

The substrate 100 may include a semiconductor substrate such as a silicon substrate, germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

The first impurity region 103 may be formed by implanting n-type impurities or p-type impurities into the upper portion of the substrate 100. In an exemplary embodiment of the present invention, the impurities may include n-type impurities such as phosphorus or arsenic.

In an exemplary embodiment of the present invention, after forming a mask layer and a photoresist layer pattern on the substrate 100, the mask layer may be patterned, forming a mask having a photoresist pattern. The upper portion of the substrate 100 may be etched using the photoresist pattern and the mask as etch masks, thus forming the first trench 105 and the second trench 107. In an exemplary embodiment of the present invention, the first trench 105 and the second trench 107 may be formed by a dry etching process. After the dry etching process, an asking process may be performed, removing a remaining photoresist pattern. As illustrated in FIG. 1B, the first trench 105 may have a width larger than a width of the second trench 107.

In this case, an upper portion of the substrate 100, where the first trench 105 and the second trench 107 are not disposed, may be defined as an active pattern 110. Each active pattern 110 may have a first width W1 as viewed in plan view and a first height H1 from bottom surfaces of the first trench 105 and the second trench 107. In an exemplary embodiment of the present invention, a plurality of active patterns 110 may be arranged in a first direction, and each of the active patterns 110 may extend in a second direction substantially perpendicular to the first direction. For example, as illustrated in FIG. 1A, the active patterns 110 may be spaced apart from each other by a first distance D1 in a third direction that may make an acute angle with respect to the first direction. Two active patterns 110 adjacent to each other may constitute a pair of active patterns 110. Pairs of active patterns 110 may be spaced apart from each other by a second distance D2 in the third direction. Active patterns 110 adjacent to each other may be separated from each other by the second trench 107, and pairs of active patterns 110 may be separated from each other by the first trench 105. The second distance D2 may be larger than the first distance D1.

During an ashing process for removing the photoresist pattern, an upper portion of the substrate 100, e.g., upper portions of the active patterns 110, may be anisotropically etched by oxygen plasma. Therefore, a dent 113 may be formed on a sidewall of the upper portion of the active pattern 110. The sidewall of the upper portion of the active pattern 110 may have a curved profile, instead of a straight profile. Accordingly, the upper portion of the active pattern 110 may have a smaller width as compared with when the sidewall of the upper portion of the active pattern 110 has a straight profile.

Figure 2A:
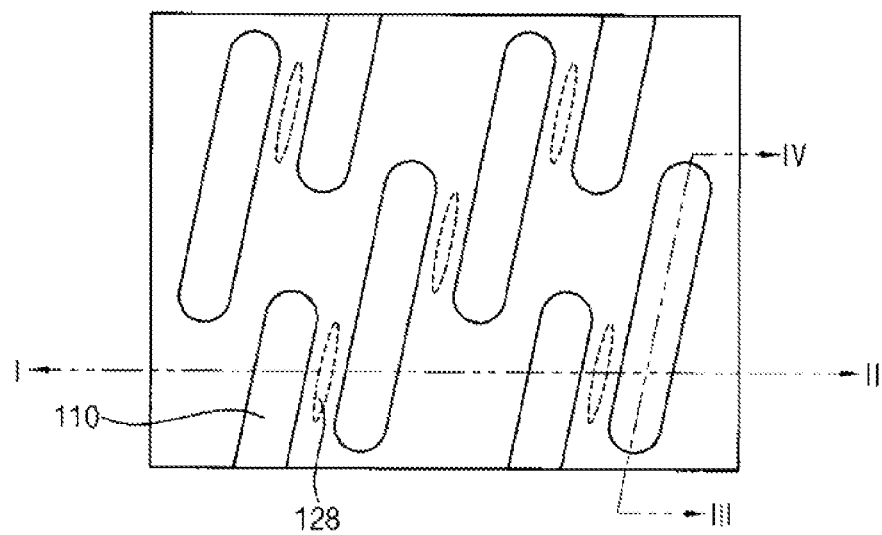
Figure 2B:
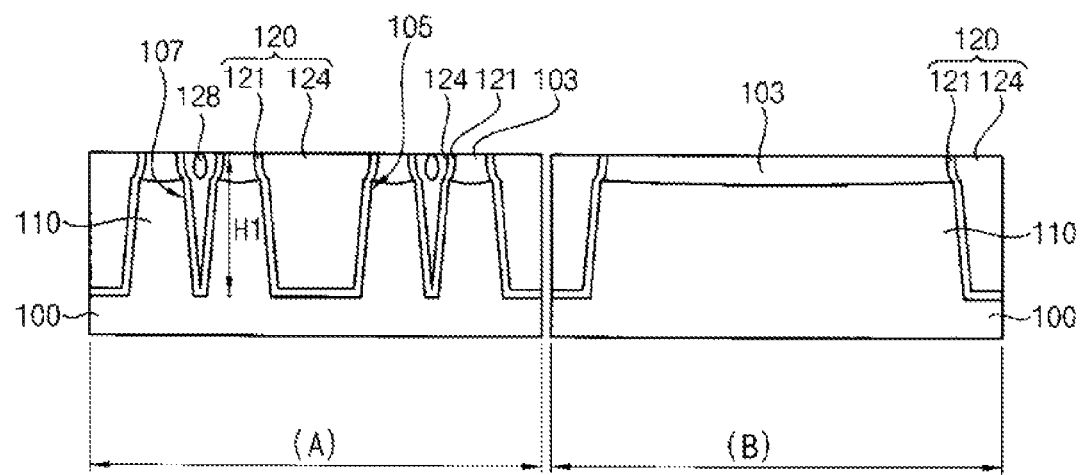

Referring to FIGS. 2A and 2B, after forming at least one insulation layer to fill the first trench 105 and the second trench 107, an upper portion of the insulation layer may be removed, thus forming an isolation layer 120.

For example, a first insulation layer and a second insulation layer may be sequentially formed on the substrate 100 and the active patterns 110 and may fill the first trench 105 and the second trench 107. The upper portions of the first insulation layer and the second insulation layer may be planarized by a chemical mechanical polishing (CMP) process until a top surface of the active pattern 110 is exposed, thus forming a first insulation layer pattern 121 and a second insulation layer pattern 124.

In an exemplary embodiment of the present invention, the first insulation layer may be formed of an oxide such as middle temperature oxide (MTO), and the second insulation layer may be formed of a nitride such as silicon nitride (SiN).

As illustrated in FIG. 2B, the first insulation layer pattern 121 and the second insulation layer pattern 124 may fully fill the first trench 105 and may partially fill the second trench 107. The first insulation layer pattern 121 may be conformally formed on an inner wall of the second trench 107 (that is, a side wall of the active pattern 110). Therefore, the first insulation layer pattern 121 may have a profile curved along the dent 113 on the sidewall of the upper portion of the active pattern 110. During the formation process of the first and second insulation layer pattern 121 and 124, a void 128 may occur in the second trench 107 having a relatively small width. The second insulation layer pattern 121 may surround the void 128. The void 128 may locate between active patterns 110 adjacent to each other, and may extend in the second direction.

The first insulation layer pattern 121 and the second insulation layer pattern 124 may define the isolation layer 120, and the isolation layer 120 may electrically isolate the active patterns 110 from each other.

Figure 3A:
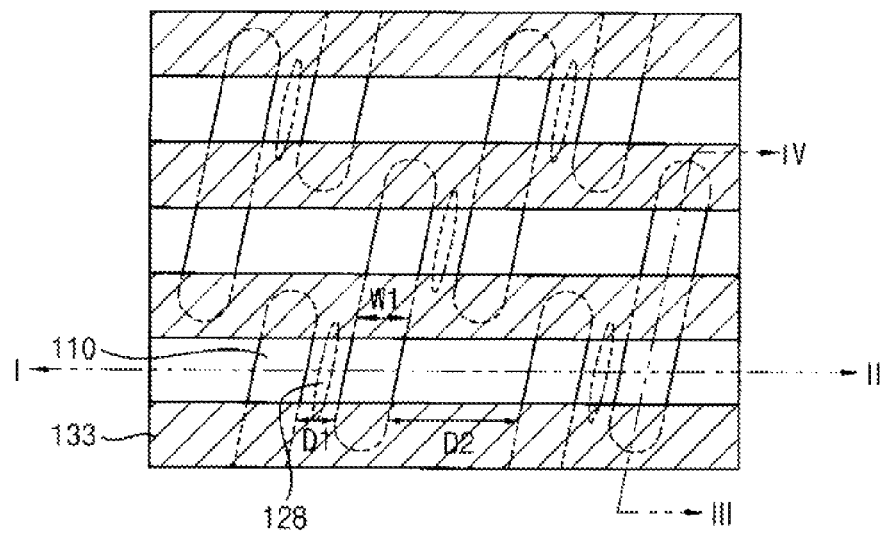
Figure 3B:
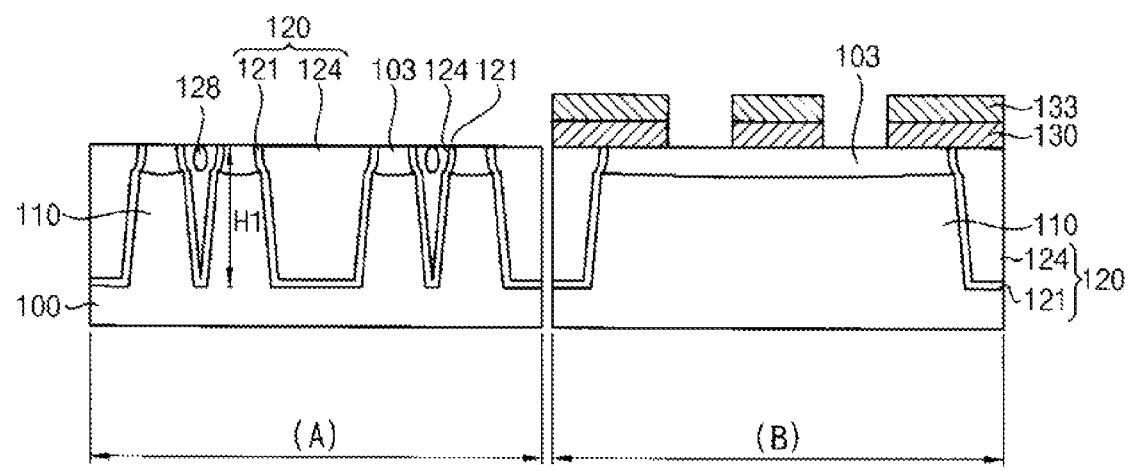

Referring to FIGS. 3A and 3B, a mask 130 and a photoresist pattern 133 may be formed on the active patterns 110 and the isolation layer 120.

After forming a mask layer and a photoresist layer on the active patterns 110 and the isolation layer 120, the photoresist layer may be patterned forming the photoresist pattern 133, and the mask layer may be patterned by an etching process using the photoresist pattern 133, thus forming the mask 130.

In an exemplary embodiment of the present invention, the photoresist layer may be formed of an organic material layer such as an amorphous carbon layer (ACL), and the mask layer may be formed of an oxide such as middle temperature oxide (MTO).

In an exemplary embodiment of the present invention, a plurality of masks 130 and a plurality of photoresist patterns 133 may be arranged in a fourth direction substantially perpendicular to the third direction. Each of the masks 130 and each of the photoresist patterns 133 may extend in the third direction.

Figure 4A:
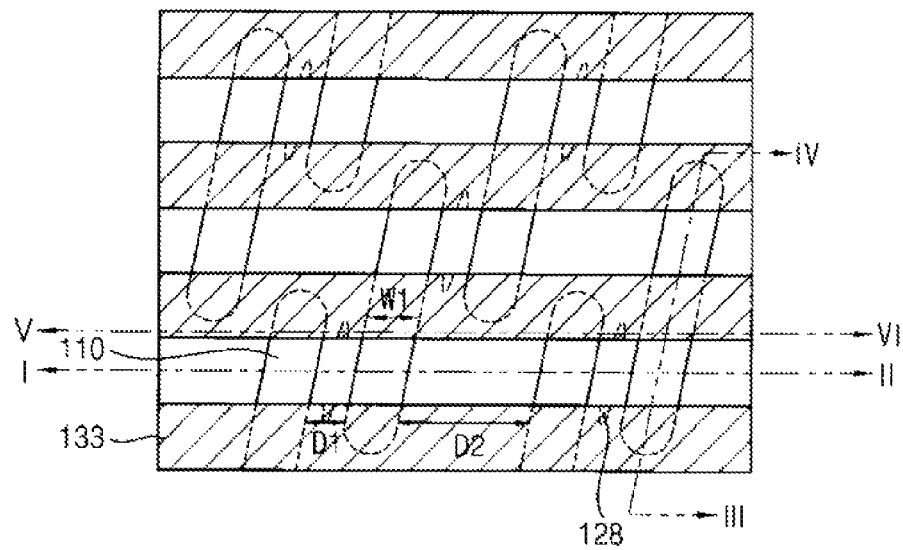
Figure 4B:
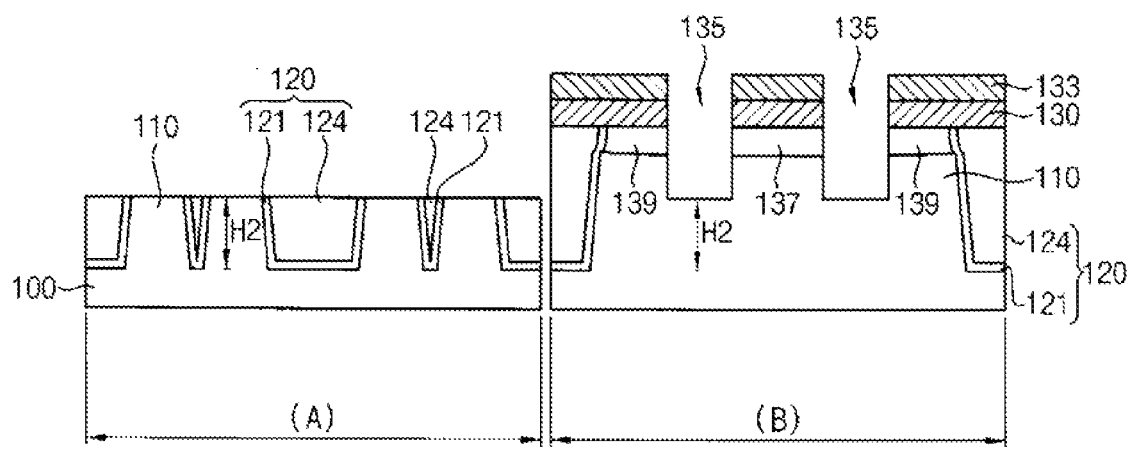
Figure 4C:
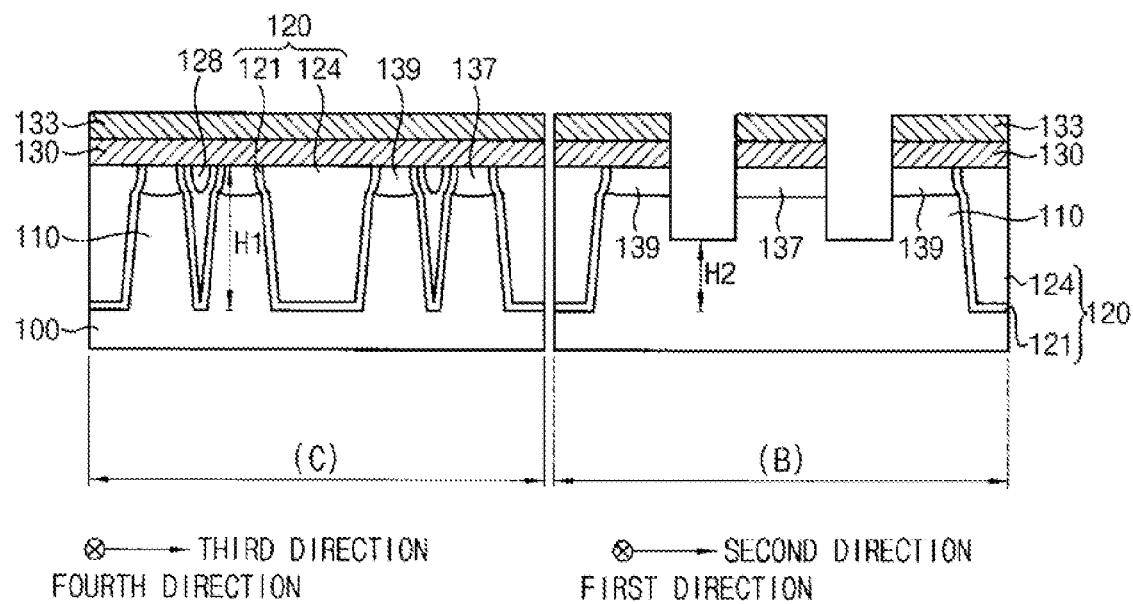

Referring to FIGS. 4A, 4B and 4C, upper portions of the active patterns 110 and the isolation layer 120 may be etched using the photoresist pattern 133 and the mask 130 as etching masks, forming a recess 135.

The recess 135 may be defined by upper surface of the etched active pattern 110 and the etched isolation layer 120 and by side walls of the active pattern 110, the isolation layer 120, the mask 130 and the photoresist patterns 133. In an exemplary embodiment of the present invention, a plurality of recesses 135 may be arranged in the fourth direction. Each of the recesses 135 may extend in the third direction. Therefore, the active pattern 110 disposed under the recess 135 may have a second height H2 smaller than the first height H1.

By an etching process, an upper portion of the isolation layer 120, which is exposed by the mask 130, may be removed, and thus, the void 128 disposed in the removed isolation layer 120 also may be removed. However, as illustrated in FIG. 4C, the void 128 disposed in the isolation layer 120, which is covered by the mask 130, may remain. The void 128 overlapping the mask 130 may be enlarged by the etching process.

Further, by forming the recess 135, the first impurity region 103 may be divided into a second impurity region 137 and a third impurity region 139. The second and third impurity regions 137 and 139 may function as a source region and a drain region, respectively, of a transistor.

Figure 5A:
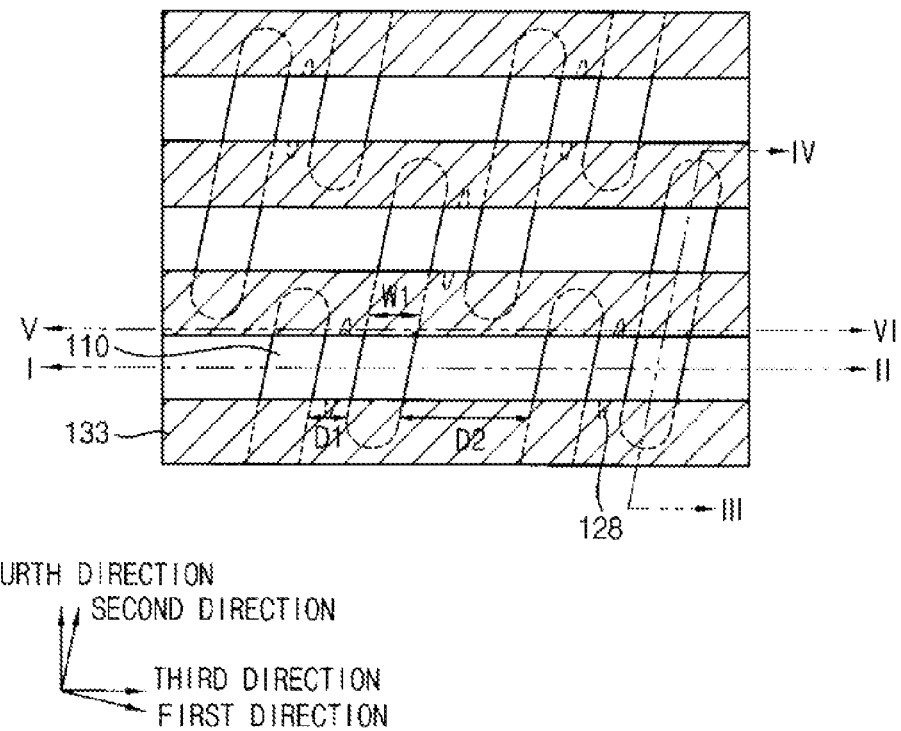
Figure 5B:
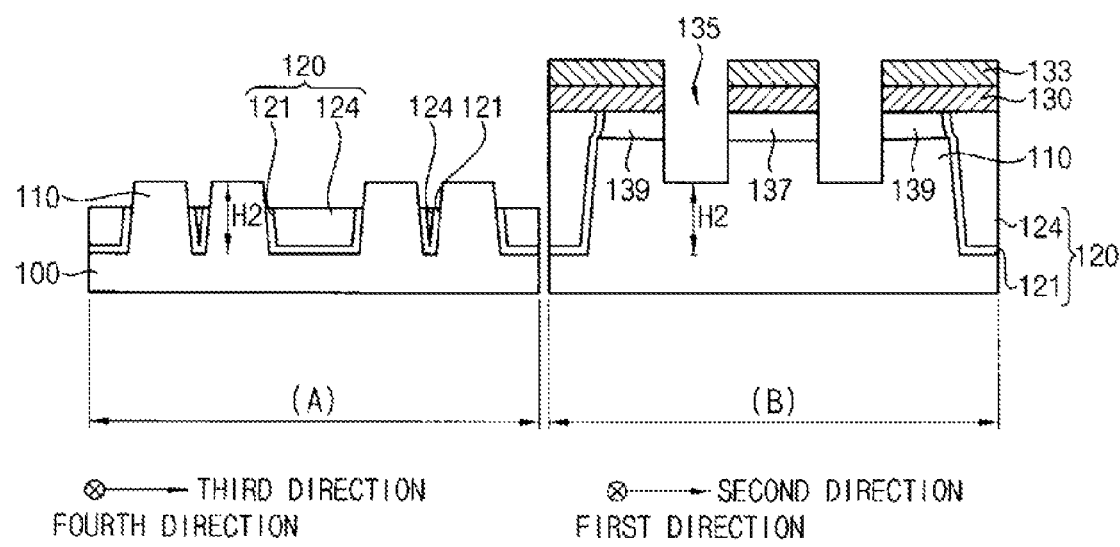

Referring to FIGS. 5A and 5B, an upper portion of the isolation layer 120, which is exposed by the mask 130, may be partially removed, leaving the active patterns 110 being projected beyond a top surface of the isolation layer 120.

The upper portion of the isolation layer 120 may be selectively removed by a wet etching process using an etching solution having an etch selectivity between the isolation layer 120 and the active patterns 110. Therefore, the active pattern 110 projected beyond the top surface of the isolation layer 120 may form a semiconductor fin.

Figure 6A:
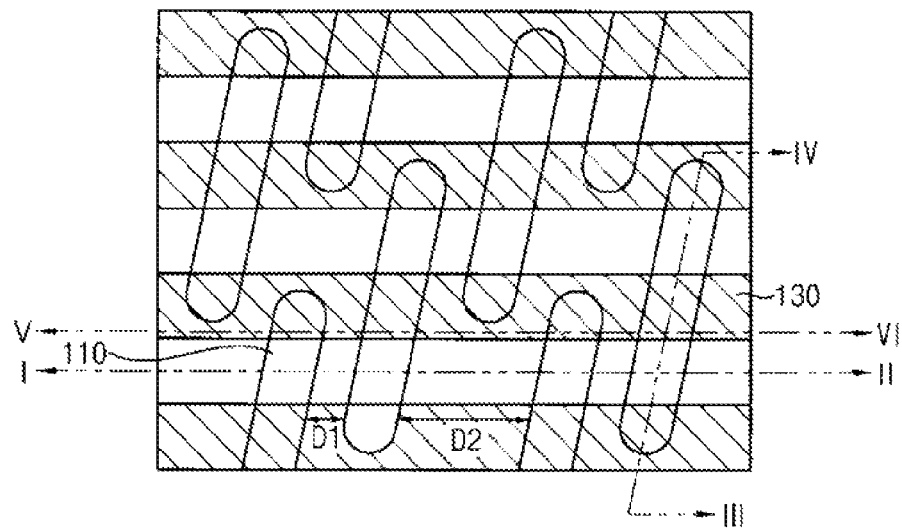
Figure 6B:
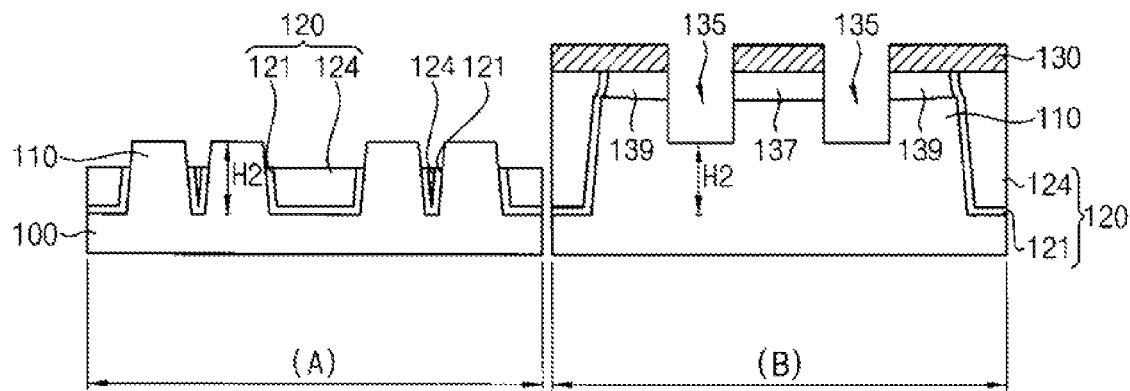
Figure 6C:
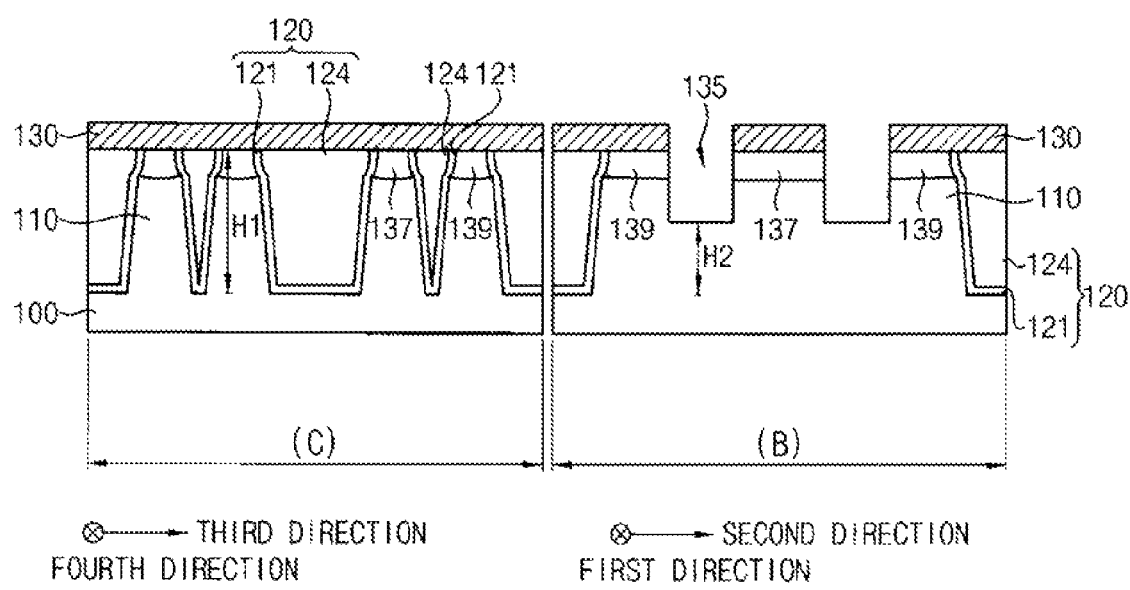

Referring to FIGS. 6A, 6B and 6C, a plasma treatment process may be performed, removing the void 128 and the photoresist pattern 133.

The plasma treatment process may be performed under an atmosphere including oxygen. In an exemplary embodiment of the present invention, the plasma treatment process may be performed under an atmosphere including oxygen and nitrogen (or oxygen and an inert gas such as argon) at a temperature of about 250° C. to about 300° C. In this case, a mixing ratio of oxygen to nitrogen may be about 10:1. The plasma treatment process may be performed at a power of about 4000 Watts to about 5000 Watts for about 60 seconds to about 180 seconds. When the plasma treatment process is performed for a shorter time than about 60 seconds, the second insulation layer pattern 124 may not be oxidized enough to fill the void 128 sufficiently.

The plasma treatment process may oxidize the second insulation layer pattern 124. For example, when the second insulation layer pattern 124 includes SiN, the plasma treatment process may oxidize SiN into silicon oxy-nitride. Therefore, the volume of the second insulation layer pattern 124 may increase, and thus, the second insulation layer pattern 124 may fill the void 128 as illustrated in FIG. 6C. Accordingly, the void 128 may be prevented from being filled with a material that forms a gate electrode 150 (see, FIGS. 7A and 7B), thus avoiding a malfunction of the transistor.

By the plasma treatment process, the photoresist pattern 133 including an organic material may be removed. In an exemplary embodiment of the present invention, when the photoresist pattern 133 includes an amorphous carbon layer, the amorphous carbon layer may react with oxygen plasma, thus creating gaseous carbon dioxide. Therefore, the photoresist pattern 133 may be sufficiently removed. For example, the plasma treatment process may include an asking process for removing the photoresist pattern 133.

Referring to FIGS. 7A and 7B, a gate insulation layer pattern 140 may be formed on an inner wall of the recess 135, and then a gate electrode 150 may partially fill the recess 135.

A gate insulation layer and a gate electrode layer may be sequentially formed on the active pattern 110, isolation layer 120 and the inner wall of the recess 135, and then upper portions of the gate insulation layer and the gate electrode layer may be removed, thus forming the gate insulation layer pattern 140 and the gate electrode 150.

In an exemplary embodiment of the present invention, the gate insulation layer may be formed of a silicon oxide or a metal oxide by a chemical vapor deposition (CVD) process or an atomic layer deposition (ALD) process. In an exemplary embodiment of the present invention, the gate insulation layer may be formed by thermally oxidizing a surface of active patterns 110 that is exposed by the recess 135. The gate electrode layer may be formed of doped polysilicon, a metal or a metal nitride by a physical vapor deposition (PVD) process, an ALD process or a sputtering process. For example, the gate electrode layer may be formed by using titanium nitride (TiN), tantalium nitride (TaN) or tungsten (W). The gate electrode layer may sufficiently fill the recess 135.

Upper portions of the gate insulation layer and the gate electrode layer may be planarized by a chemical mechanical polishing (CMP) process and/or an etch back process. For example, the upper portion of the gate insulation layer disposed on the mask 130 may be removed, forming the gate insulation layer pattern 140. The gate electrode layer disposed on the mask 130 may be partially removed by the CMP process, and a portion of the gate electrode layer partially filling an upper portion of the recess 135 may be removed by an anisotrophic etching process, thus forming the gate electrode 150 filling a lower portion of the recess 135. In an exemplary embodiment of the present invention, the gate electrode 150 may have a top surface substantially lower than a top surface of the active pattern 110. Therefore, the gate electrode 150 may be a buried gate electrode.

Figure 8A:
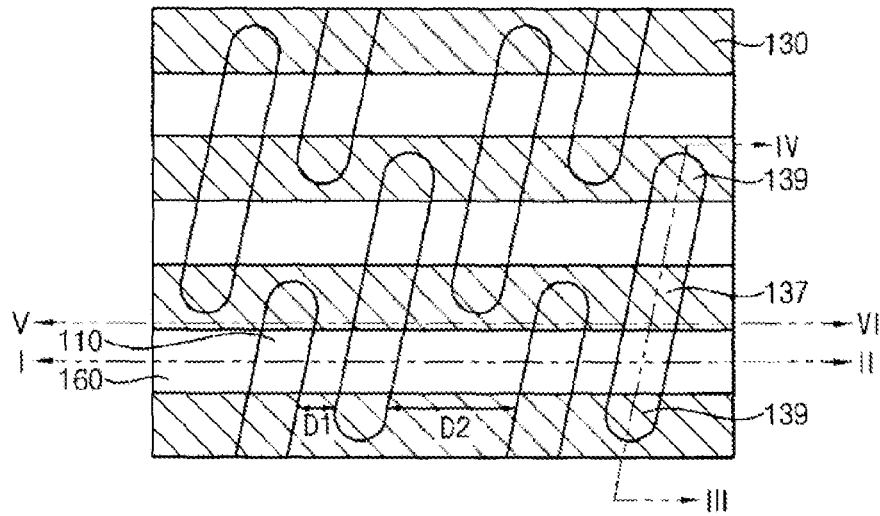
Figure 8B:
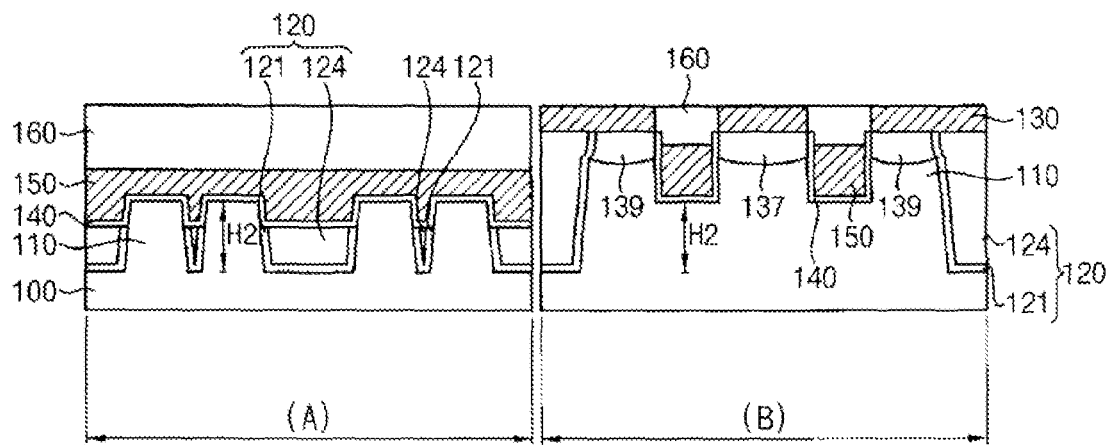

Referring to FIGS. 8A and 8B, a capping layer pattern 160 may fill the upper portion of the recess 135.

A capping layer may be formed on the gate electrode 150, the gate insulation layer pattern 140 and the mask 130, and then an upper portion of the capping layer may be planarized by a CMP process and/or an etch back process, forming the capping layer pattern 160. For example, the capping layer may be formed of silicon nitride and/or silicon oxide. The planarization process may be performed until the top surface of the mask 130 is exposed.

Accordingly, the transistor may include the gate electrode 150, the gate insulation layer pattern 140, the first and second impurity regions 137 and 139.

According to an exemplary embodiment of the present invention, the method of forming the transistor may include a plasma treatment process. The plasma treatment process may oxidize the second insulation layer pattern 124, filling the void 128 in the second insulation layer pattern 124. The plasma treatment process may remove the photoresist pattern 133. For example, the oxidization of the second insulation layer pattern 124 and removal of the photoresist pattern 133 may be performed substantially simultaneously. Therefore, the material of the gate electrode 150 might not fill the void 128, thus preventing a defect of the transistor. Accordingly, the costs and time for forming the transistor may be reduced, and the reliability of the transistor may be improved.

FIGS. 9 to 12 are cross-sectional views illustrating a method of forming a transistor in accordance with an exemplary embodiment of the present invention.

FIGS. 9, 10, 11 and 12 each include a cross-section view (B) taken along line III-IV of FIG. 1A and a cross-section view (C) taken along line V-VI of FIGS. 1A.

Figure 9:
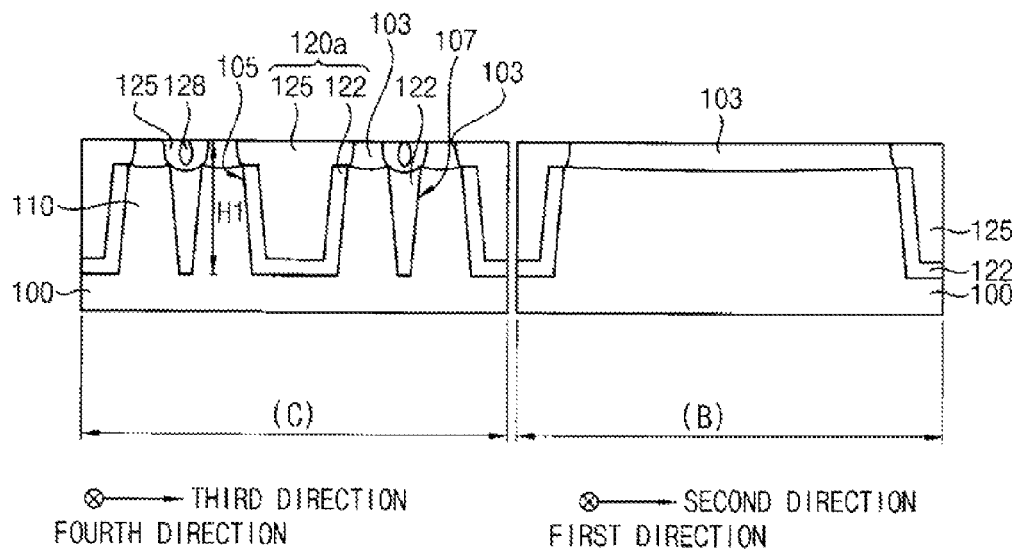
FIGS. 9 to 12 are cross-sectional views illustrating a method of forming a transistor in accordance with an exemplary embodiment of the present invention.

Referring to FIG. 9, after forming a first impurity region 103 on an upper portion of a substrate 100 by implanting impurities, the upper portion of the substrate 100 may be partially removed, forming a first trench 105 and a second trench 107. Active patterns 110 may be defined by the first trench 105 and the second trench 107. An isolation layer 120a may fill the first trench 107 and the second trench 107.

Processes for forming the first impurity region 103, the first trench 105, the second trench 107 and the active patterns 110 may be substantially the same as or similar to processes illustrated with reference to FIGS. 1A and 1B.

Then, a first insulation layer pattern 122 may fill lower portions of the first and second trenches 105 and 107, and a second insulation layer pattern 125 may fill remaining portions of the first and second trenches 105 and 107, thus forming the isolation layer 120a.

The first insulation layer pattern 122 may be formed by forming a first insulation layer on the substrate 100 and the active patterns 110 and filling the first and second trenches 105 and 107, by planarizing upper portions of the first insulation layer until top surfaces of the active patterns 110 are exposed, and by partially removing the first insulation layer filling upper portions of the first and second trenches 105 and 107. Further, the second insulation layer pattern 125 may be formed by forming a second insulation layer on the first insulation layer pattern 122 and the active pattern 110 and by planarizing upper portions of the second insulation layer until top surfaces of the active patterns 110 are exposed. In an exemplary embodiment of the present invention, the first insulation layer may be formed of an oxide such as middle temperature oxide (MTO), and the second insulation layer may be formed of a nitride such as silicon nitride (SiN).

A void 128 may be created in the second insulation layer pattern 125. The void 128 may extend in a fourth direction.

Figure 10:
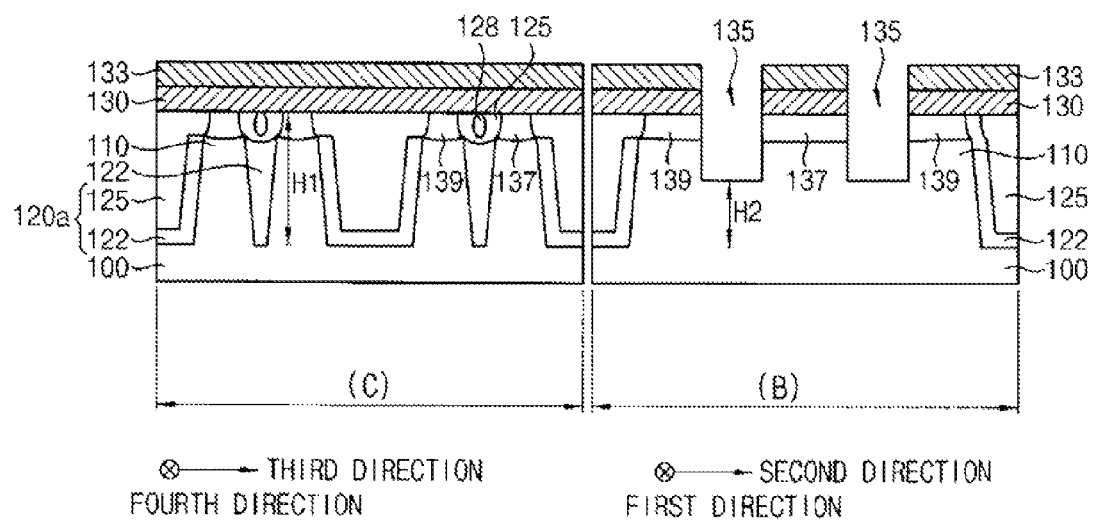

Referring to FIG. 10, a mask 130 and a photoresist pattern 133 may be formed on the active patterns 110 and the isolation layer 120, and upper portions of the active patterns 110 and the isolation layer 120 may be etched using the photoresist pattern 133 and the mask 130 as etching masks, forming a recess 135.

By the etching process for forming the recess 135, an upper portion of the isolation layer 120, which is exposed by the mask 130, may be removed, and thus, the void 128 disposed in the removed isolation layer 120 also may be removed. However, the void 128 disposed in the isolation layer 120, which is covered by the mask 130, might not be removed. Alternatively, the void 128 overlapping the mask 130 may be enlarged by the etching process.

Figure 11:
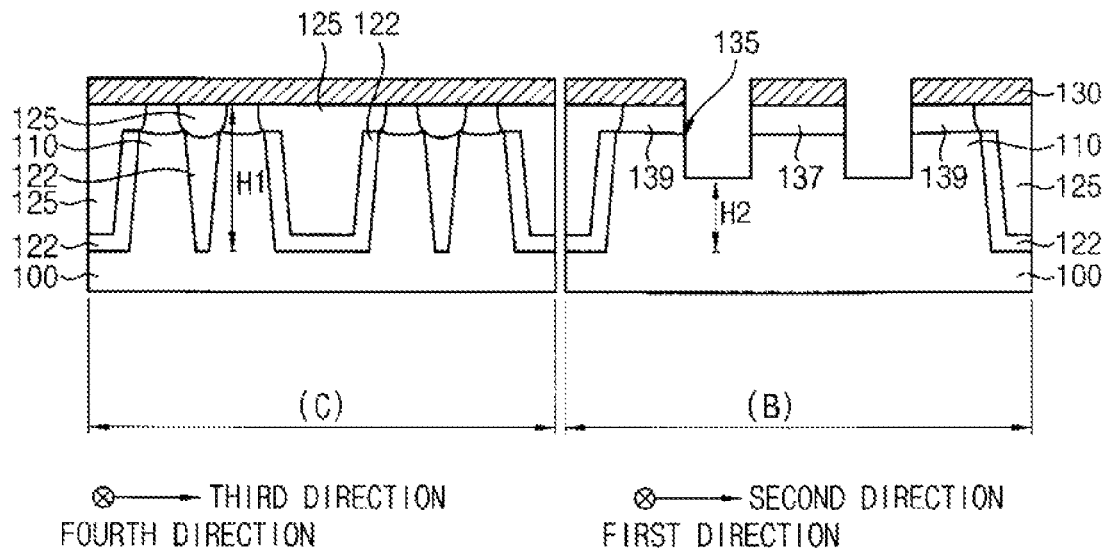

Referring to FIG. 11, a plasma treatment process may be performed removing the void 128 and the photoresist pattern 133.

The plasma treatment process may be performed under an atmosphere including oxygen. The conditions for the plasma treatment process may be substantially the same as or similar to conditions described above with reference to FIGS. 6A, 6B and 6C. The plasma treatment process may oxidize the second insulation layer pattern 125, and a volume of the second insulation layer pattern 125 may increase, and thus, the second insulation layer pattern 125 may fill the void 128 therein. Further, by the plasma treatment process, the photoresist pattern 133 including an organic material may be removed, e.g., substantially simultaneously with filling the void 128.

Figure 12:
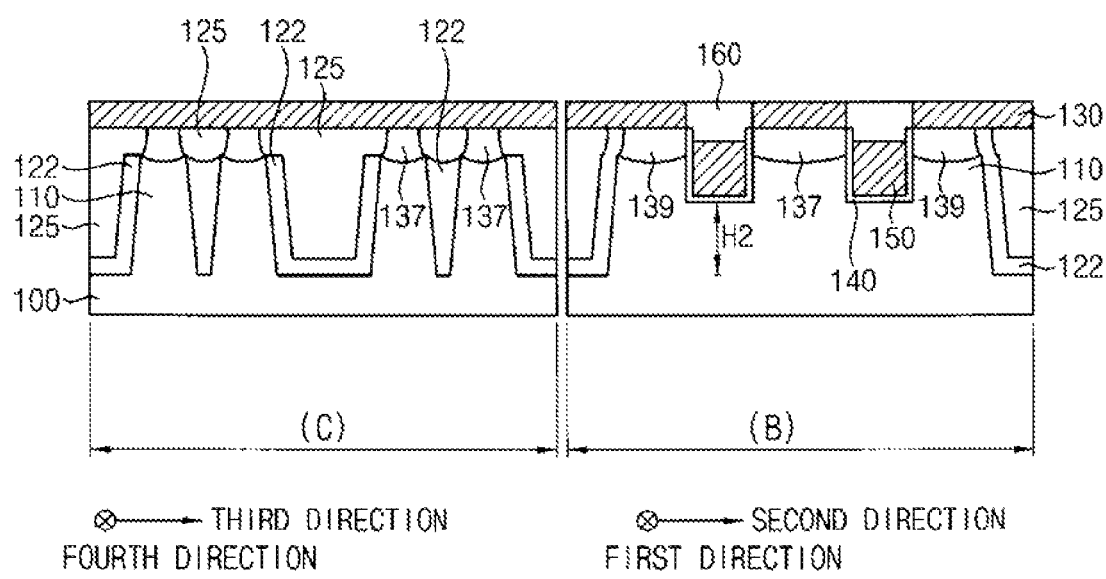

Referring to FIG. 12, a gate insulation layer pattern 140, a gate electrode 150 and a capping layer pattern 160 may be formed, filling the recess 135. For example, processes substantially the same or similar to processes described above in connection with FIGS. 7 and 8 may be performed, completing the transistor.

According to an exemplary embodiment of the present invention, the method of forming the transistor may include a plasma treatment process. The plasma treatment process may oxydize the second insulation layer pattern 125, filling the void 128 in the second insulation layer pattern 125. For example, simultaneously with oxidizing the second insulation layer pattern 125, the plasma treatment process may remove the remaining photoresist pattern 133. Accordingly, the costs and time for forming the transistor may be reduced, and the reliability of the transistor may be improved.

Figure 13:
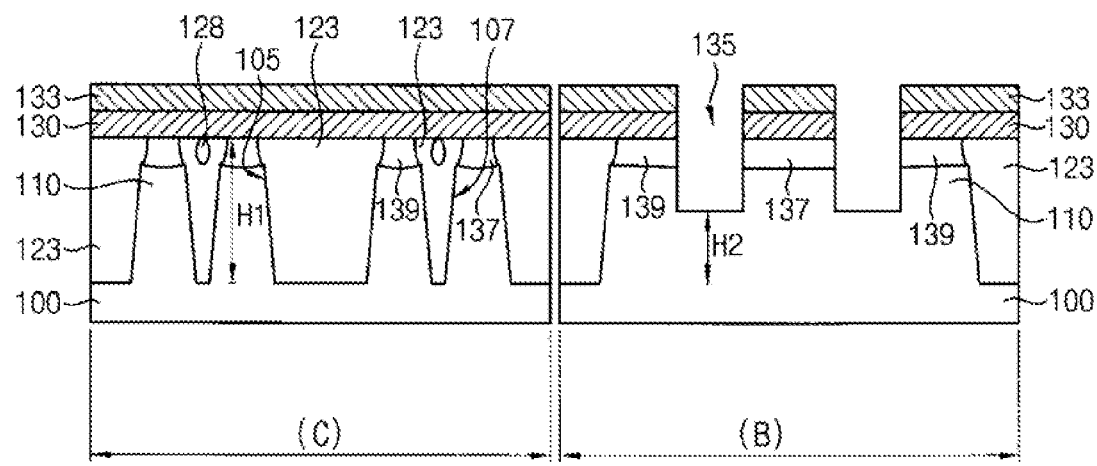
FIGS. 13 to 14 are cross-sectional views illustrating a method of forming a transistor in accordance with an exemplary embodiment of the present invention.
Figure 14:
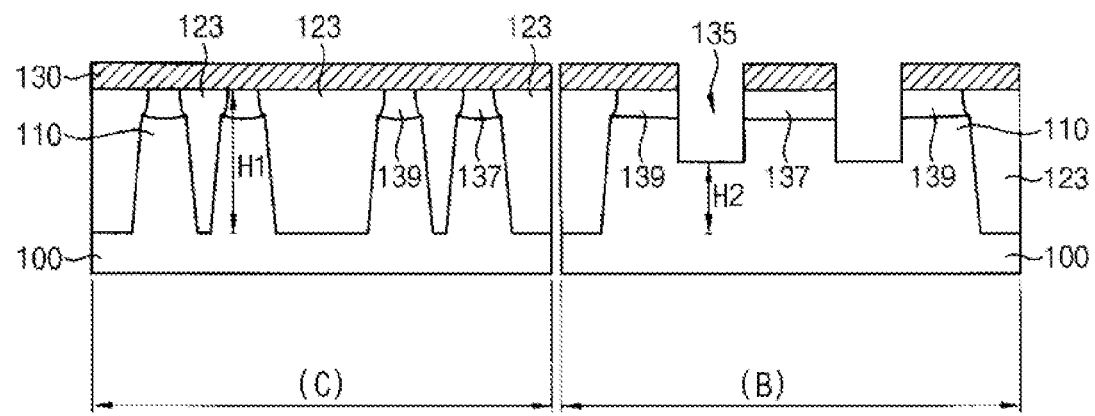

FIGS. 13 and 14 are cross-sectional views illustrating a method of forming a transistor in accordance with an exemplary embodiment of the present invention. The method of forming the transistor may be substantially the same as or similar to processes described above with reference to FIGS. 1 to 8.

FIGS. 13 and 14 each include a cross-section view (B) taken along line III-IV of FIGS. 1A and a cross-section view (C) taken along line V-VI of FIGS. 1A.

Processes substantially the same as or similar to processes described above with reference to FIGS. 1 to 3 may be performed. However, a first trench 105 and the second trench 107 may be filled with the first insulation layer pattern 123. For example, a void 128 may be formed in the first insulation layer pattern 123. In an exemplary embodiment of the present invention, the first insulation layer pattern 123 may be formed of an oxide such as MTO.

Referring to FIG. 13, upper portions of the active patterns 110 and the isolation layer 120 may be etched using the photoresist pattern 133 and the mask 130 as etching masks, forming a recess 135.

Referring to FIG. 14, a plasma treatment process may be performed, removing the void 128 and the photoresist pattern 133.

The plasma treatment process may be performed under an anosphere including oxygen and nitrogen. The conditions for the plasma treatment process may be substantially the same as or similar to conditions described above with reference to FIGS. 6A, 6B and 6C. However, a mixing ratio of oxygen to nitrogen may be below about 10:1. For example, the mixing ratio of oxygen to nitrogen may about 1:1.

The plasma treatment process may nitrify the first insulation layer pattern 123, and a volume of the first insulation layer pattern 123 may increase, thus filling the void 128. Further, by the plasma treatment process, the photoresist pattern 133 including an organic material may be removed, for example, substantially simultaneously with nitrifying the first insulation layer pattern 123.

Then, processes substantially the same as similar to processes described above in connection with FIGS. 7 and 8 may be performed, completing the transistor.

According to an exemplary embodiment of the present invention, the method of forming the transistor may include a plasma treatment process. The plasma treatment process may nitrify the first insulation layer pattern 123, thus filling the void 128 in the first insulation layer pattern 123. For example, simultaneously with nitrifying the first insulation layer pattern 123, the plasma treatment process may remove the remaining photoresist pattern 133. Accordingly, the costs and time for forming the transistor may be reduced, and the reliability of the transistor may be improved.

Figure 16:
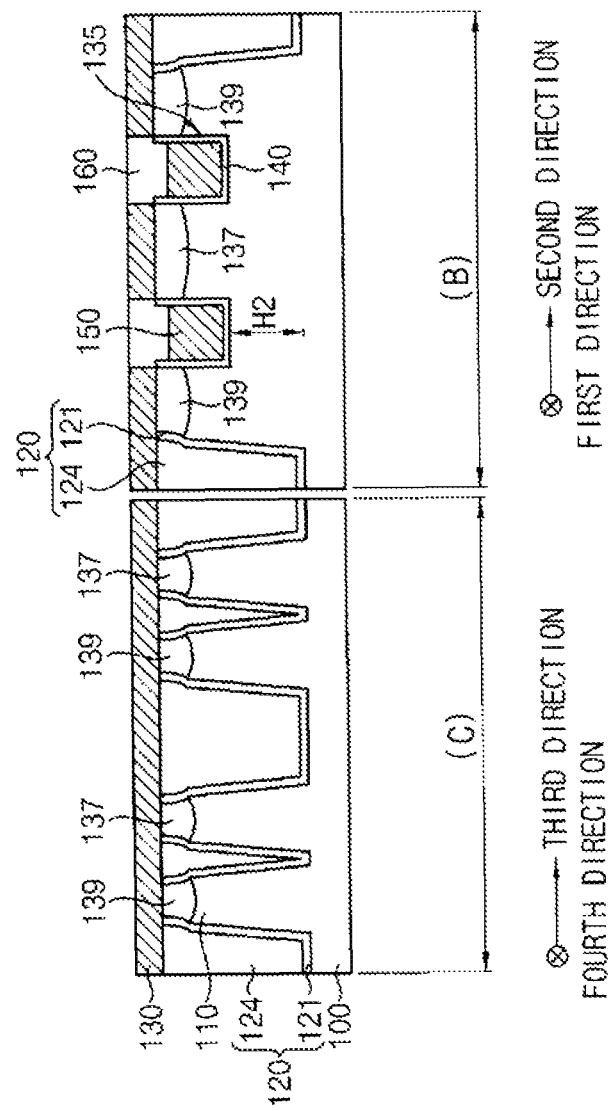
FIGS. 16 to 18 are cross-sectional views illustrating a method of forming a semiconductor device in accordance with an exemplary embodiment of the present invention.
Figure 17:
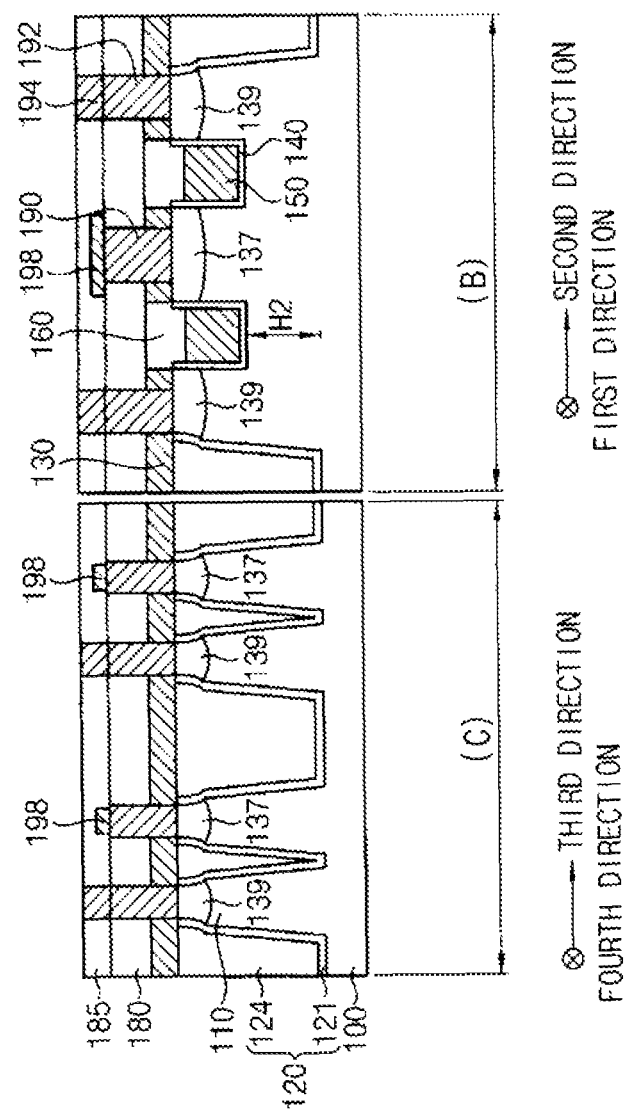
Figure 18:
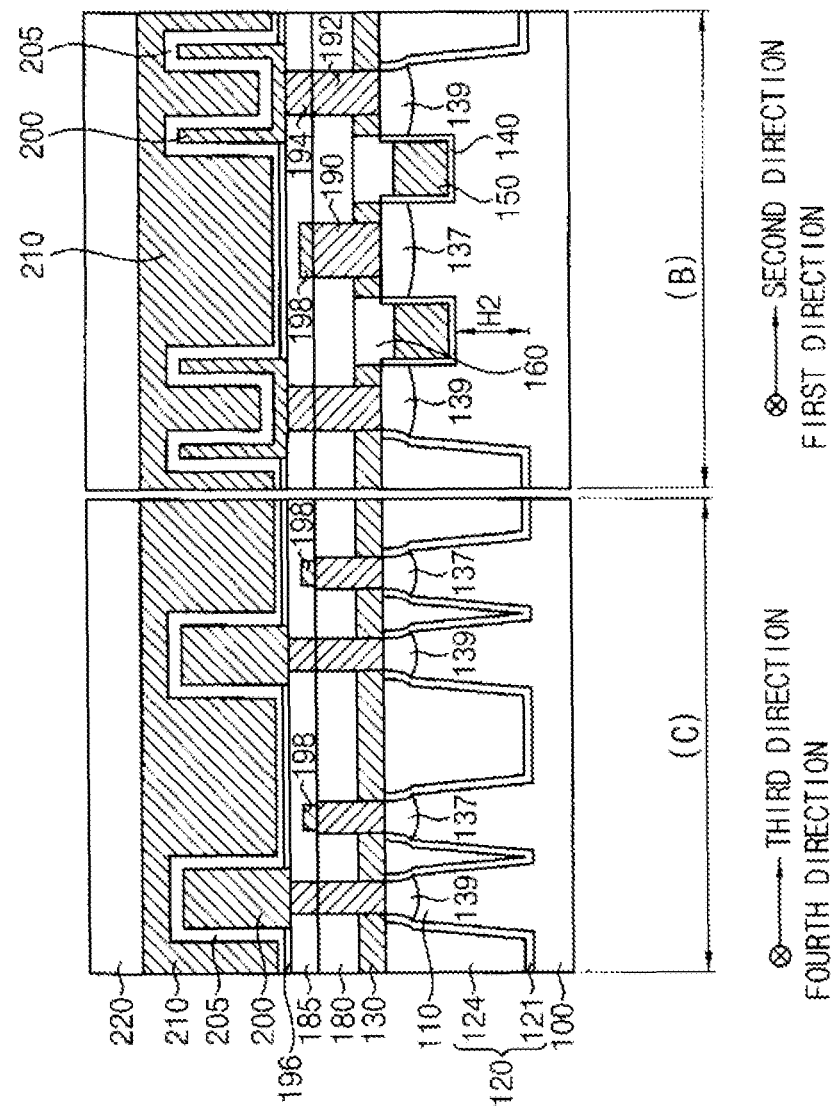

FIG. 15 is a plan view illustrating a method of forming a semiconductor device in accordance with an exemplary embodiment of the present invention, and FIGS. 16 to 18 are cross-sectional views illustrating a method of forming a semiconductor device in accordance with an exemplary embodiment of the present invention.

Referring to FIG. 15, a plurality of first active patterns 110 may be arranged in a first direction on an upper portion of a substrate 100. Each of the first active patterns 110 may extend in a second direction substantially perpendicular to the first direction. A plurality of gate electrodes 150 may be arranged in a fourth direction, which may make an acute angle with the second direction. Each of the gate electrodes 150 extend in a third direction substantially perpendicular to the fourth direction on the active pattern 110. A plurality of bit lines 198 may extend in the fourth direction.

FIGS. 16, 17 and 18 each include a cross-section view (B) taken along line III-IV of FIG. 15 and a cross-section view (C) taken along line V-VI of FIG. 15.

Referring to FIG. 16, a transistor including a buried gate electrode 150 may be formed on the substrate 100. A method of forming the transistor may be substantially the same as or similar to a method as described above with reference to FIGS. 1 to 8.

After forming an impurity region on an upper portion of the substrate 100 by implanting impurities, the upper portion of the substrate 100 may be partially removed, forming a first trench and a second trench. After forming at least one insulation layers filling the first and second trenches, upper portions of the insulation layers may be removed, forming an isolation layer 120. A void may occur in the isolation layer 120. Upper portions of the active patterns 110 and the isolation layer 120 may be etched using the photoresist pattern and the mask 130 as etching masks, thus forming a recess 135. A plasma treatment process may be performed, removing the void 128 and the photoresist pattern. A gate insulation layer pattern 140, a gate electrode 150 and a capping layer pattern 160 may fill the recess 135.

Referring to FIG. 17, a first insulating interlayer 180, a second insulating interlayer 185, a first plug 190, a second plug 192, a third plug 194 and a bit line 198 may be formed on the substrate 100.

A first insulating interlayer 180 may be formed on the substrate 100, covering the capping layer pattern 160, the mask 130, first and second impurity regions 137 and 139 and the isolation layer 120. In an exemplary embodiment of the present invention, the first insulating interlayer 180 may be formed of silicon oxide. In an exemplary embodiment of the present invention, a blocking layer including a silicon nitride may be formed under the first insulating interlayer 180, covering the capping layer pattern 160, the mask 130, first and second impurity regions 137 and 139 and the isolation layer 120.

First holes may be formed through the first insulating interlayer 180 and the mask 130, exposing the first and second impurity regions 137 and 139. A first conductive layer filling the first holes may be formed on the first insulating interlayer 180, the first impurity region 137 and the second impurity region 139, and an upper portion of the first conductive layer may be planarized by a CMP process and/or an etch back process until the top surface of the first insulating interlayer 180 is exposed, thus forming a first plug 190 and a second plug 192. The first plug 190 may contact the first impurity region 172, and the second plug 192 may contact the second impurity region 174. For example, the first conductive layer may be formed of doped polysilicon, a metal, etc. The first plug 190 may function as a bit line contact.

A bit line 198 may be formed on the first insulating interlayer 180 by forming a second conductive layer contacting the first plug, and by patterning the second conductive layer. As illustrated in FIG. 15, a plurality of bit lines 198 may be arranged in the third direction, and each of the bit lines 198 may extend in the fourth direction. The second conductive layer may be formed of doped polysilicon, a metal, etc.

A second insulating interlayer 185 may be formed on the first insulating interlayer 180, covering the bit line 198. The second insulating interlayer 185 may be partially etched, forming second holes exposing the second plug 192. A third conductive layer may be formed on the second insulating interlayer 185, filling the second holes. An upper portion of the third conductive layer may be planarized by a CMP process and/or an etch back process, forming a third plug 194. For example, the third conductive layer may be formed of doped polysilicon, a metal, etc. The second and third plugs 329 and 335 each may function as a capacitor contact. Alternatively, the third plug 194 may directly contact the second impurity region 174 without forming the second plug 192. The third plug 194 may function as a capacitor contact.

Referring to FIG. 18, a capacitor may be electrically connected to the transistor.

An etch stop layer 196 and a mold layer may be formed on the third plug 194 and the second insulating interlayer 185. In an exemplary embodiment of the present invention, the etch stop layer 196 may be formed of silicon nitride, and the mold layer may be formed of silicon oxide. Third holes may be formed through the mold layer and the etch stop layer 196. The third holes expose the third plug 194. A fourth conductive layer may be formed on inner walls of the third holes and the mold layer. A sacrificial layer may be formed on the fourth conductive layer, filling the third holes. The fourth conductive layer may be formed of a metal, a metal nitride and/or a metal silicide. Upper portions of the sacrificial layer and the fourth conductive layer may be planarized until a top surface of the mold layer is exposed. The sacrificial layer may be removed, forming a lower electrode 200 on the inner walls of the third holes.

A dielectric layer 205 may be formed on the lower electrode 200 and the etch stop layer 196. The dielectric layer 205 may be formed of a material having a high dielectric constant such as tantalum oxide, hafnium oxide, aluminum oxide, zirconium oxide and/or a combination thereof.

An upper electrode 210 may be formed on the dielectric layer 205. The upper electrode 210 may be formed of doped polysilicon, a metal, a metal nitride and/or a metal silicide.

The lower electrode 200, the dielectric layer 205 and the upper electrode 210 may define a capacitor.

A third insulating interlayer 220 may be formed on the second insulating interlayer 185, thus covering the capacitor.

Accordingly, the semiconductor device may be manufactured.

Figure 19:
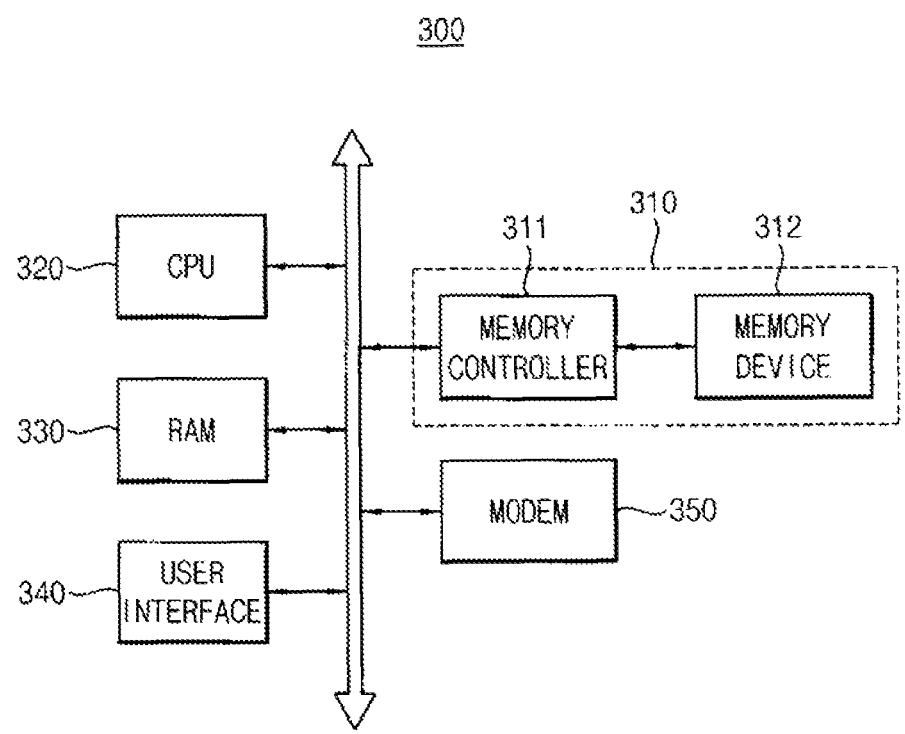
FIG. 19 is a block diagram illustrating a system in accordance with an exemplary embodiment of the present invention.

FIG. 19 is a block diagram illustrating a system in accordance with exemplary embodiments.

Referring to FIG. 19, a computing system 300 may include a microprocessor (CPU) 320 electrically connected to a system bus, a random access memory (RAM) 330, a user interface 340, a modem 350 such as a baseband chipset, and a memory system 310. The memory system 310 may include a memory device 312 and a memory controller 311. The memory controller 311 may be configured to control the memory device 312. The memory system 310 may function as, e.g., a memory card or a solid state disk (SSD) by a combination of the memory device 312 and the memory controller 311. When the computing system 300 is utilized for a mobile device, a battery may be further provided to supply an operating voltage to the computing system 300. In an exemplary embodiment of the present invention, the computing system 300 may include an application chipset, a camera image processor, a mobile dynamic RAM (DRAM), or the like.

According to exemplary embodiments of the present invention, a method of forming a transistor may include a plasma treatment process. The plasma treatment process may oxidize or nitrify an isolation layer, thus filling a void in the isolation layer. The plasma treatment process may remove a remaining photoresist pattern. Therefore, a material of a gate electrode might not fill the void, and thus, a defect of the transistor may be prevented. Accordingly, the costs and time for forming the transistor may be reduced, and the reliability of the transistor may be improved.

Although exemplary embodiments of the present invention have been described, those skilled in the art will readily appreciate that many modifications may be made thereto without departing from of the scope of the present inventive concept.

What is claimed is:

1. A method of forming a transistor, the method comprising:
   forming a trench and active patterns by partially removing an upper portion of a substrate;
   partially filling the trench with an isolation layer, the isolation layer having a void therein;
   forming a photoresist pattern on the active patterns and the isolation layer;
   forming a recess by partially removing the active patterns and the isolation layer using the photoresist pattern as an etching mask;
   removing the photoresist pattern and filling the void by performing a plasma treatment process; and
   filling the recess with a gate insulation layer and a gate electrode.

2. The method of claim 1, wherein forming the isolation layer comprises:
   forming a first insulation layer pattern on an inner wall of the trench using an oxide; and
   forming a second insulation layer pattern on the first insulation layer pattern using a nitride, wherein the void is disposed in the second insulation layer pattern.

3. The method of claim 1, wherein the plasma treatment process is performed under an atmosphere including oxygen.

4. The method of claim 1, wherein performing the plasma treatment process comprises oxidizing the second insulation layer pattern.

5. The method of claim 1, wherein performing the plasma treatment process comprises ashing the photoresist pattern by using an oxygen plasma.

6. The method of claim 1, wherein forming the isolation layer comprises forming a first insulation layer pattern on an inner wall of the trench using an oxide, and wherein the void is disposed in the first insulation layer pattern.

7. The method of claim 6, wherein performing the plasma treatment process is performed under an atmosphere including oxygen and nitrogen.

8. The method of claim 6, wherein performing the plasma treatment process comprises nitrifying the first insulation layer pattern.

9. The method of claim 1, wherein the plasma treatment process is performed for about 60 seconds to about 180 seconds.

10. The method of claim 1, wherein the gate electrode has a top surface lower than a top surface of the substrate.

11. The method of claim 1, further comprising forming an impurity region by implanting impurities into an upper portion of the substrate, wherein the impurity region functions as a source region or a drain region of the transistor.

12. A method of manufacturing a semiconductor device, the comprising:
   forming a trench and active patterns by partially removing an upper portion of a substrate;
   partially filling the trench with an isolation layer, the isolation layer having a void therein;
   forming a photoresist pattern on the active patterns and the isolation layer;
   forming a recess by partially removing the active patterns and the isolation layer using the photoresist pattern as an etching mask;
   removing the photoresist pattern and filling the void by performing a plasma treatment process;

filling the recess with a gate insulation layer and a gate electrode;

forming an insulating interlayer on the substrate, the insulating interlayer receiving a plug electrically connected to the substrate; and forming a capacitor electrically connected to the plug, the capacitor including a lower electrode, a dielectric layer and an upper electrode.

13. The method of claim 12, wherein forming the isolation layer comprises:

forming a first insulation layer pattern on an inner wall of the trench using an oxide; and forming a second insulation layer pattern on the first insulation layer pattern using a nitride, wherein the void is disposed in the second insulation layer pattern.

14. The method of claim 12, wherein the plasma treatment process is performed under an atmosphere including oxygen.

15. The method of claim 12, wherein the plasma treatment process comprises oxidizing the second insulation layer pattern and/or ashing the photoresist pattern by using an oxygen plasma.

* * * * *